United States Patent
Hornik et al.

(10) Patent No.: US 7,198,959 B2
(45) Date of Patent: Apr. 3, 2007

(54) PROCESS FOR FABRICATION OF A FERROCAPACITOR

(75) Inventors: Karl Hornik, Hopewell Junction, NY (US); Rainer Bruchhaus, Munich (DE); Bum-Ki Moon, Poughkeepsie, NY (US)

(73) Assignee: Infineon Technologies AG, Munich (DE)

( * ) Notice: Subject to any disclaimer, the term of this patent is extended or adjusted under 35 U.S.C. 154(b) by 192 days.

(21) Appl. No.: 10/881,338

(22) Filed: Jun. 30, 2004

(65) Prior Publication Data

US 2006/0003469 A1   Jan. 5, 2006

(51) Int. Cl.
*H01L 21/00* (2006.01)
(52) U.S. Cl. .......................... 438/3; 257/295
(58) Field of Classification Search ............... 438/3; 257/295
See application file for complete search history.

(56) References Cited

U.S. PATENT DOCUMENTS 6,300,653 B1   10/2001   Pan
7,031,138 B2 *   4/2006   Moon et al. ............ 361/312

\* cited by examiner

*Primary Examiner*—Doug Menz
(74) *Attorney, Agent, or Firm*—Slater & Matsil, L.L.P.

(57) ABSTRACT

In a process for fabricating a ferrocapacitor comprising providing ferroelectric PZT elements over an $Al_2O_3$ layer, the $Al_2O_3$ layer is covered with a seed layer comprising layers of PZT and $TiO_2$. Then a thicker layer of PZT is formed over the seed layer and crystallized. By this process, the crystallinity of the thick PZT layer is much improved, and its orientation is improved to be in the (111) direction. Furthermore, the seed layer reduces downward diffraction of Pb from the thick PZT layer, such as through the $Al_2O_3$ into a TEOS structure beneath.

18 Claims, 4 Drawing Sheets

Still many voids and nucleation defects

Pb mushrooms after PZT crystallization

PROCESS FOR FABRICATION OF A FERROCAPACITOR

TECHNICAL FIELD

The present invention relates to fabrication processes for ferroelectric devices which include one or more ferrocapacitors, and to ferroelectric devices produced by the fabrication processes.

BACKGROUND

Many conventional FeRAM devices include a horizontal ferrocapacitor structure, in which a stack of layers is formed including top and bottom electrodes sandwiching a ferroelectric layer. An alternative "vertical capacitor" structure was suggested in U.S. Pat. No. 6,300,653, the disclosure of which is incorporated herein by reference. A vertical capacitor includes a ferroelectric element sandwiched between electrodes to either side, all at substantially the same level in the FeRAM device.

The vertical capacitors are typically formed over a substructure. The substructure includes various electronic components buried in a matrix (e.g. of TEOS (tetraethylorthosilicate)). The substructure further includes conductive plugs connected to the electronic components, and which extend upwards through the matrix. The upper ends of the plugs typically terminate in TiN/Ir barrier elements, having a top surface flush with the surface of the matrix.

Conventionally, in a process for forming a vertical capacitor, an insulating layer of amorphous $Al_2O_3$ is formed over the surface of the matrix, and a thicker layer of ferroelectric material is formed over that, and then crystallized in an oxygen atmosphere. The ferroelectric material may be a perovskite such as PZT ($PbZrTiO_3$). The $Al_2O_3$ layer acts as a seed layer for crystallization of the PZT (or other ferroelectric), and has the further function of inhibiting oxygen diffusion into the substructure during the PZT crystallization.

Hardmask elements are then deposited over selected areas of the PZT layer, and the portions of the PZT and $Al_2O_3$, which are not protected by the hardmask elements are etched all the way through, forming openings.

The openings are then filled with conductive material such as $IrO_2$, by depositing $IrO_2$ over the entire structure, and chemical-mechanical planarization (CMP) polishing is performed to form a flat upper surface, which is partly the PZT and partly the conductive material. Then, an $Al_2O_3$ layer is formed over the surface. The elements of $IrO_2$ constitute electrodes, while the remaining PZT elements constitute the dielectric elements of the ferrocapacitors. At least some of the electrodes may be in electrical contact with the plugs, via the barrier elements.

The vertical capacitor structure has great potential for reducing the cell size, especially if the angle between the horizontal direction and the sides of the remaining PZT elements is high. However, for the PZT to perform effectively it should have a high degree of crystallinity, and furthermore the crystallization should have the correct orientation. Usually, despite the seed layer effect of the $Al_2O_3$, PZT deposited on alumina still shows poor crystallinity, with random orientation. This is illustrated in FIG. 1, which shows a diffraction spectrum for various angles for three different types of substrate, corresponding to the lines 1, 2, 3. Line 1 is HT $Al_2O_3$ (here "HT" means deposited at a high temperature; line 1 corresponds to 400° C.), line 2 is HT $Al_2O_3$ with added oxygen (that is, oxygen is a component of the sputter gas. Thus, whereas line 1 was produced using only Ar as sputter gas, line 2 used an $Ar/O_2$ (ratio 30/20) mixture), line 3 is the case that the $Al_2O_3$ substrate is formed by atomic layer deposition (ALD). The peak indicative of the PZT (111) orientation is a position of about 38.5°.

It is known that the crysallinity can be increased by introducing a very thin seed layer (such as $TiO_2$) over the amorphous $Al_2O_3$ before the PZT is deposited. FIG. 2 shows the diffraction spectrum for various types of seed. Line 4 shows the case that there is no seed layer (note that line 4 on FIG. 2 is different from line 1 on FIG. 2 due to slightly different deposition conditions), line 5 shows the case that a seed layer is formed of Ti having a thickness of 25 Å, and line 6 shows the case that a seed layer of Ti having a thickness of 25 Å is formed and, before the PZT is deposited, the Ti is oxidized to $TiO_2$. Although the (111) peak at 38.5° is higher in lines 3 and 6 than in lines 1, 2, 4 and 5, it is still relatively low. Also, the PZT morphology is still very poor including voids and nucleation defects. Two electron microscope images, obtained in the experiment illustrated as line 6 of FIG. 2, are shown as FIGS. 3(a) and (b). In FIG. 3(a), the TEOS layer is shown as 7, the $Al_2O_3$ as 8 and the PZT as 9. The PZT includes regions indicated by the ovals in FIG. 3(a) with voids and nucleation defects. Furthermore, as shown in FIG. 3(b), the $Al_2O_3$ layer 8 and especially the TEOS layer 7 include darker "mushrooms" where lead (Pb) has diffused into the TEOS.

SUMMARY OF THE INVENTION

In certain aspects, the present invention aims to provide a new and useful process for fabricating ferrocapacitors, and to provide devices including such ferrocapacitors.

In general terms, the preferred embodiment of the present invention proposes that in a vertical capacitor fabrication technique in which a relatively thick layer of PZT is formed over an $Al_2O_3$ layer, a relatively thin seed layer including both PZT and at least one of $TiO_2$, $HfO_2$ or $ZrO_2$ should be formed over the $Al_2O_3$ layer before the PZT is deposited. Most preferably, the oxide is $TiO_2$.

The seed layer preferably includes at least one layer of PZT and also at least one layer of $TiO_2$ (or $HfO_2$ or $ZrO_2$). The layers composing the seed layer may be formed in either order over the substrate in different embodiments of the invention.

The seed layer is typically of a total thickness less than 10 nm.

Typically, the $TiO_2$ (or $HfO_2$ or $ZrO_2$) layer comprised in the seed layer is formed by depositing a layer of Ti (or Hf or Zr), and then oxidizing it, e.g. by RTO (rapid thermal oxidation), simultaneously annealing the PZT and crystallizing the PZT and the $TiO_2$ (or $HfO_2$ or $ZrO_2$) together. All this is preferably before the main PZT layer is deposited.

The ratio of PZT and Ti (or Hf or Zr) in the seed layer may vary, and is preferably selected in accordance with composition of the PZT in the main layer. For example, if the proportions of Pb/Zr in the main PZT are 40:60 by atomic proportions (this can be measured using X-ray fluorescent spectroscope), then we have found the properties of the main layer are optimized if the proportion of PZT/Ti is 3:1 by molecular proportions.

Following the deposition of the main PZT layer, a step is performed to crystallize it.

Specifically, a first expression of the invention is a method of forming a ferroelectric capacitor comprising forming a crystalline PZT layer by a process that includes forming a seed layer over a substructure. The seed layer has at least one PZT layer and a least one metal oxide layer, the metal oxide layer having at least one material selected from the group consisting of $TiO_2$, $HfO_2$ and $ZrO_2$, and combinations thereof. The process performs at least one first annealing step to crystallize the at least one PZT layer and the at least one metal oxide layer together. A layer of amorphous PZT is then deposited over the seed layer and a second annealing step to crystallize the amorphous PZT is performed.

BRIEF DESCRIPTION OF THE DRAWINGS

Preferred features of the invention will now be described, for the sake of illustration only, with reference to the following figures in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Referring to FIG. 4, the steps of a method, which is an embodiment of the invention are shown. In this embodiment Ti is used as an example, although it may be replaced by Hafnium (Hf) or Zirconium (Zr).

Figure 4A:
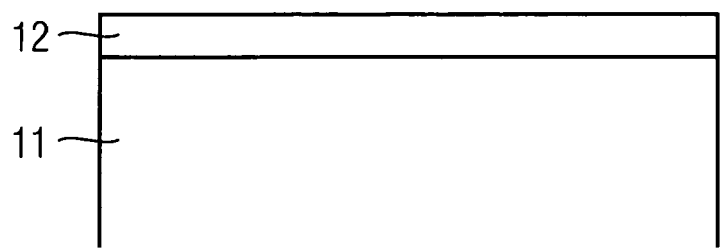
FIG. 4, which is composed of FIGS. 4(a) to 4(d), shows process steps in a method according to the invention.

The starting point, shown in FIG. 4(a), is a known structure comprising a TEOS layer 11 and an $Al_2O_3$ layer 12. In the case that the method of the invention is used to form a ferrocapacitor over a substructure containing electronic components, this TEOS layer 11 may be the top part of that substructure, and may for example include conductive plugs extending upwardly through the layer 11.

Figure 4B:
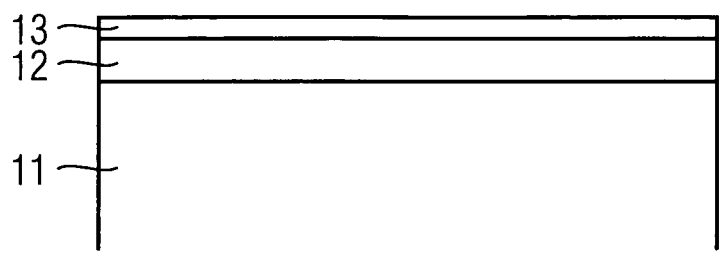

In a first step of the method, shown in FIG. 4(b), a Ti layer 13 is formed over the $Al_2O_3$ layer 12. This layer is typically of thickness less than about 5 nm.

Figure 4C:
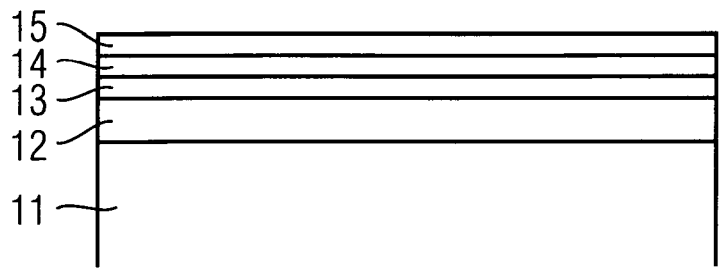

In a second step of the method, shown in FIG. 4(c), the Ti layer 13 is subjected to an oxidation process, to turn it into $TiO_2$. This may be an RTA process (rapid thermal annealing; this term covers any ambient atmosphere) in an oxygen atmosphere, which amounts to RTO (rapid thermal oxidation) at a temperature of above 500° C. (for example about 650° C.), for a duration of for example 30 seconds.

In a third step of the method, shown in FIG. 4(c), a thin layer of PZT 14 is deposited over the $TiO_2$ layer 13. Then a further layer 15 of Ti is deposited over the PZT layer 14, and the Ti layer 15 is oxidized to form $TiO_2$, e.g., by the RTO process described above. During this process, the layers 14 and 15 crystallize together to form a single seed layer. Note that no RTO step is performed between the deposition of the layer 14 and the deposition of the layer 15.

Figure 4D:
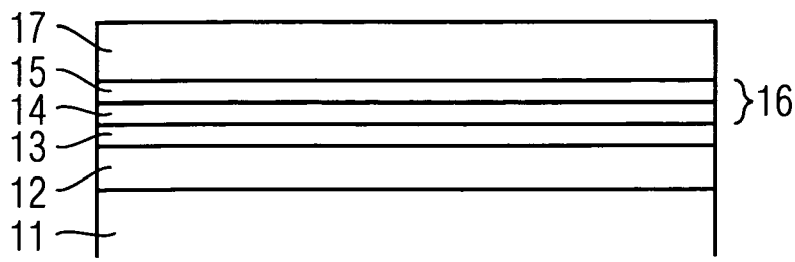

In a fourth step of the method, shown in FIG. 4(d), a layer PZT 17 is formed over the PZT/Ti seed layer 16. Then, as in conventional techniques, a step of crystallizing the PZT layer 17 is performed.

Figure 1:
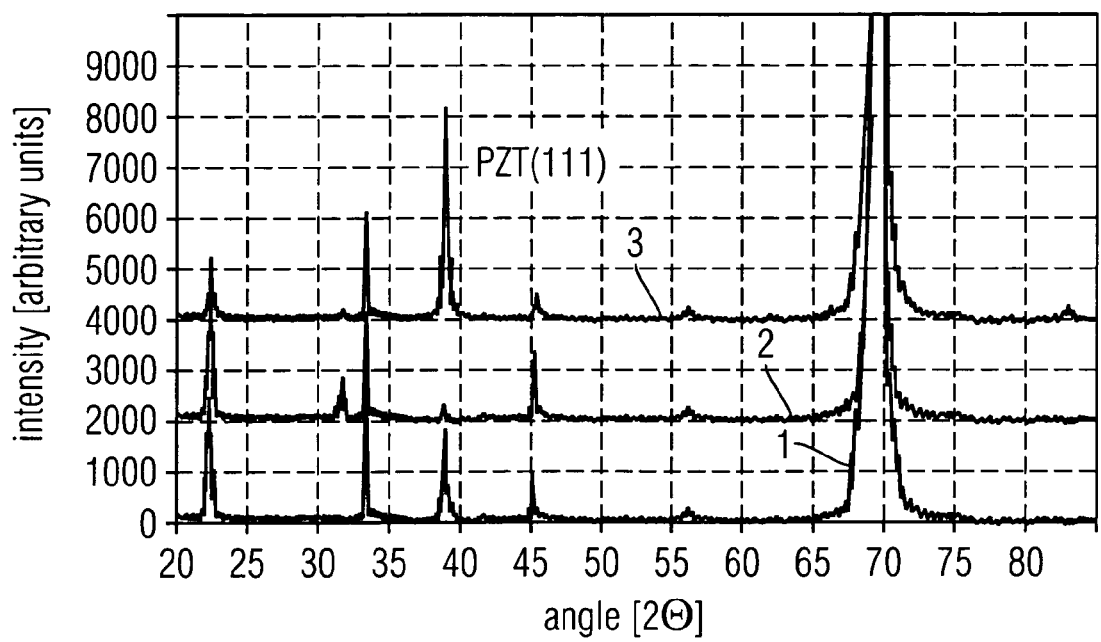
FIG. 1 shows diffraction spectra for PZT formed over three known $Al_2O_3$ structures.
Figure 2:
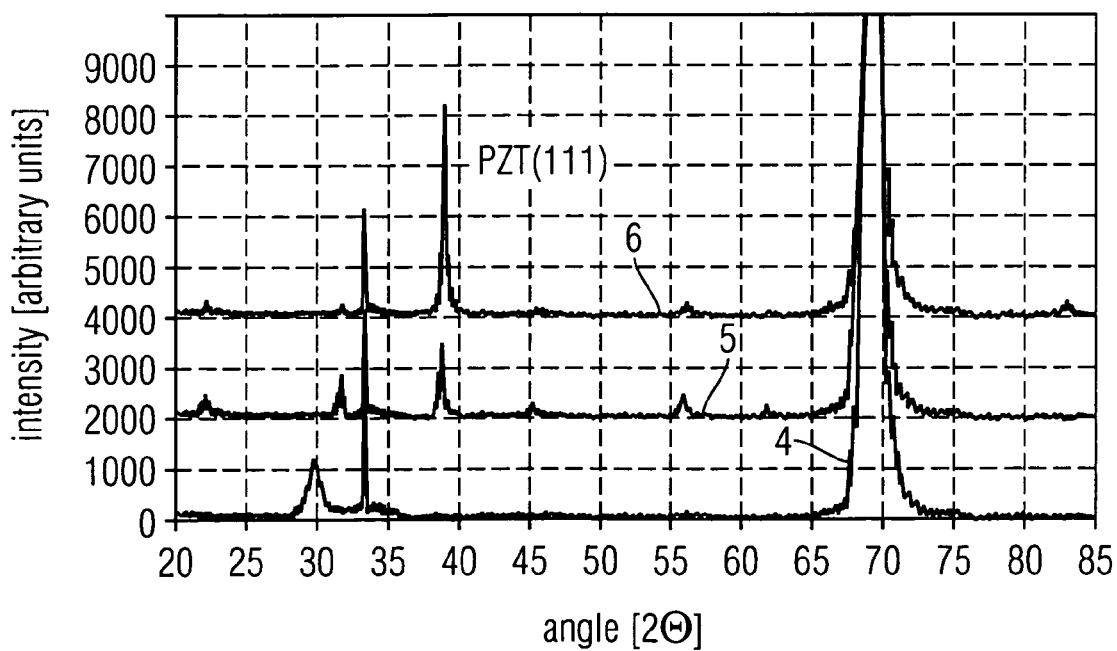
FIG. 2 shows diffraction spectra for PZT formed over an $Al_2O_3$ structure, and over two seed layers.
Figure 5:
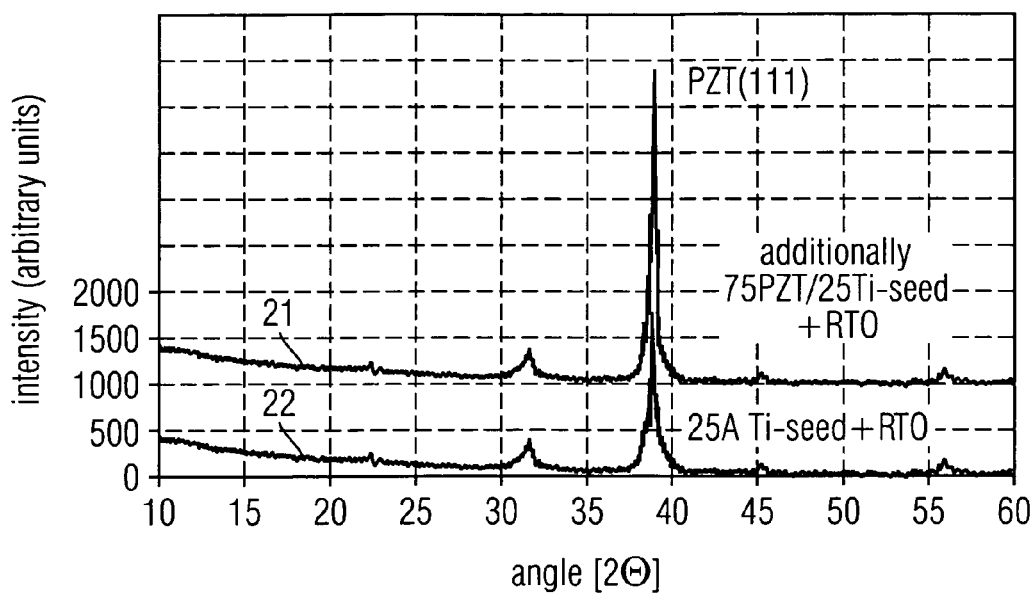
FIG. 5 is a diffraction spectrum for a result of the method of FIG. 4 and a comparative example.

Referring to FIG. 5, the diffraction spectrum of the PZT layer 17 is shown as line 21. As a comparative example, line 22 of FIG. 5 shows the diffraction spectrum of the case, shown in line 6 of FIG. 2, in which there is a seed layer, which is formed by oxidizing a 25 Å-thick layer of Ti. As will be seen, the PZT peak representing the (111) orientation is much higher in line 21 than in line 22.

Figure 3A:
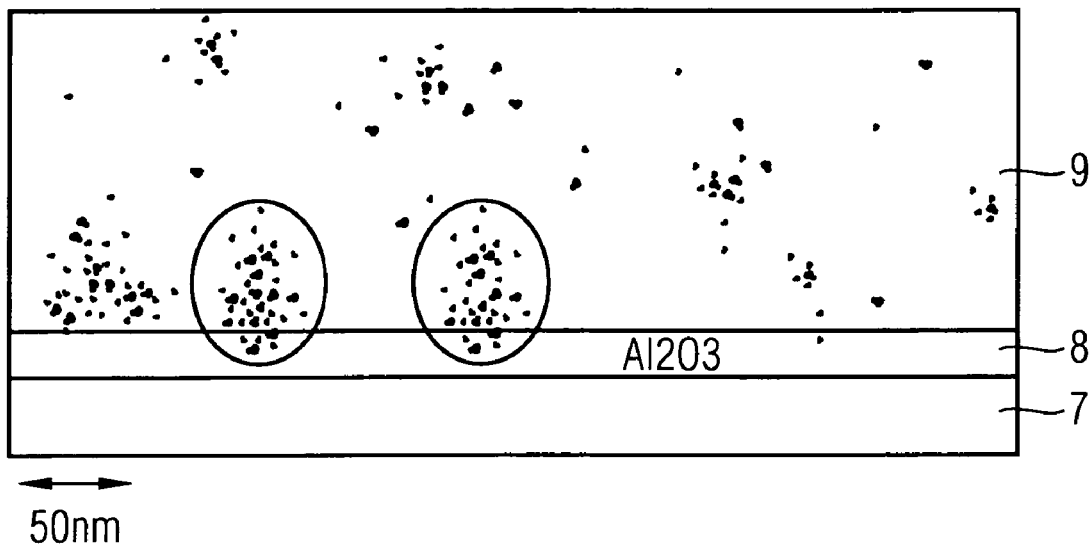
FIG. 3, which is composed of FIGS. 3(a) and 3(b), are electron microscopy images of structures formed in one of the experiments of FIG. 2.
Figure 3B:
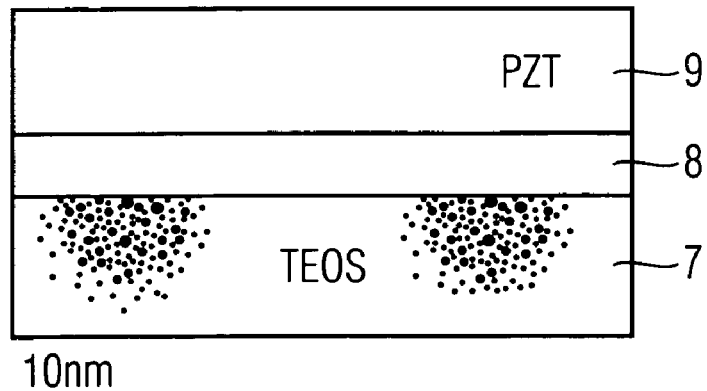
Figure 6:
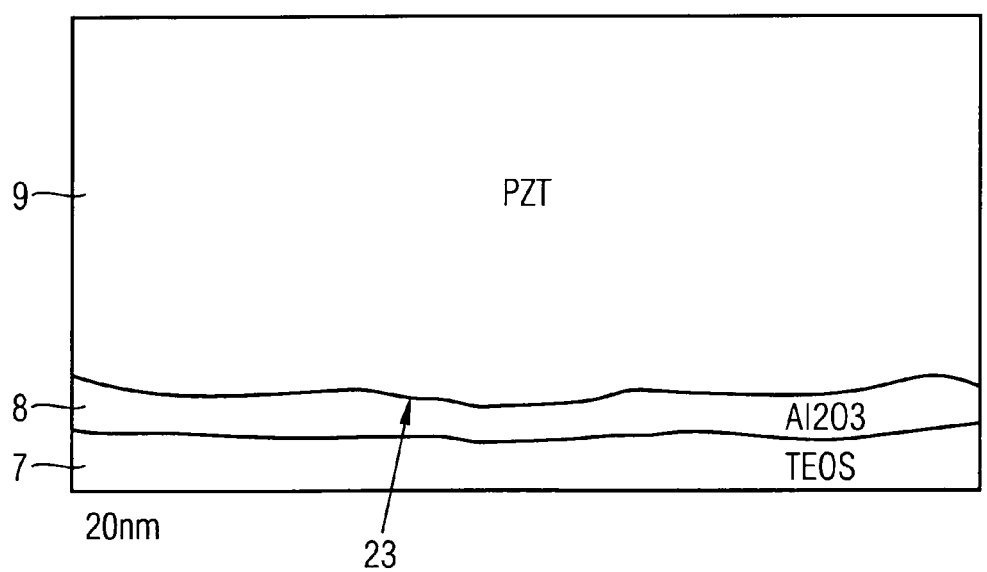
FIG. 6 shows an electron microscope image of the structure produced by the method of FIG. 4.

FIG. 6 is an electron microscope image of the product of the method of FIG. 4. The PZT shows no obvious nucleation defects, and has a dramatically decreased number of voids, compared to the images of FIG. 3. There is a sharp PZT/$Al_2O_3$ interface 23. Furthermore, there is no visible Pb diffusion into the TEOS.

Although the present invention and its advantages have been described in detail, it should be understood that various changes, substitutions and alterations can be made herein without departing from the spirit and scope of the invention as defined by the appended claims.

What is claimed is:

1. A method of forming a ferroelectric capacitor comprising forming a crystalline PZT layer by a process including the steps of:

forming a seed layer over a substructure, the seed layer comprising at least one PZT layer and a least one metal oxide layer, the metal oxide layer comprising at least one material selected from the group consisting of $TiO_2$, $HfO_2$ and $ZrO_2$, and combinations thereof;

performing at least one first annealing step to crystallize the at least one PZT layer and the at least one metal oxide layer together to form a single seed layer;

depositing a layer of amorphous PZT over the seed layer; and performing a second annealing step to crystallize the amorphous PZT.

2. A method according to claim 1 in which the lowermost layer of the seed layer is PZT.

3. A method according to claim 1 in which the metal oxide is $TiO_2$.

4. A method according to claim 3 in which the lowermost layer of the seed layer is $TiO_2$.

5. A method according to claim 1 in which the total thickness of the seed layer is less than or about equal to 10 nm.

6. A method according to claim 1 in which a further metal oxide layer is formed before the seed layer, the seed layer being formed over the further metal oxide layer.

7. A method according to claim 2 in which the seed layer includes a higher proportion of PZT than of Ti.

8. A method according to claim 7 in which the proportion of PZT/Ti in the seed layer is about 3:1.

9. A method according to claim 6, wherein the further metal oxide layer is $TiO_2$ formed by rapid thermal annealing of Ti.

10. A method of forming a ferroelectric capacitor comprising forming a crystalline PZT layer by a process including the steps of:

forming a seed layer over a substructure, the seed layer comprising at least one PZT layer and a least one metal oxide layer, the metal oxide layer comprising at least one material selected from the group consisting of $TiO_2$, $HfO_2$ and $ZrO_2$, and combinations thereof;

performing at least one first annealing step to crystallize the at least one PZT layer and the at least one metal oxide layer together;

depositing a layer of amorphous PZT over the seed subsequent to said first annealing step layer; and performing a second annealing step to crystallize the amorphous PZT.

11. A method according to claim 10 in which the lowermost layer of the seed layer is PZT.

12. A method according to claim 10 in which the metal oxide is $TiO_2$.

13. A method according to claim 12 in which the lowermost layer of the seed layer is $TiO_2$.

14. A method according to claim 10 in which the total thickness of the seed layer is less than or about equal to 10 nm.

15. A method according to claim 10 in which a further metal oxide layer is formed before the seed layer, the seed layer being formed over the further metal oxide layer.

16. A method according to claim 11 in which the seed layer includes a higher proportion of PZT than of Ti.

17. A method according to claim 16 in which the proportion of PZT/Ti in the seed layer is about 3:1.

18. The method to claim 15 wherein the further metal oxide layer is $TiO_2$ formed by rapid thermal annealing of Ti.

* * * * *